United States Patent [19]
Choi et al.

[11] Patent Number: 5,343,438
[45] Date of Patent: Aug. 30, 1994

[54] SEMICONDUCTOR MEMORY DEVICE HAVING A PLURALITY OF ROW ADDRESS STROBE SIGNALS

[75] Inventors: Yun-Ho Choi, Kyungki-do; Dae-Je Chin, Seoul; Ejaz U. Haq, Seoul; Soo-In Cho, Seoul, all of Rep. of Korea

[73] Assignee: Samsung Electronics Co., Ltd., Kyungki-do, Rep. of Korea

[21] Appl. No.: 9,475

[22] Filed: Feb. 1, 1993

[30] Foreign Application Priority Data

Jan. 31, 1992 [KR] Rep. of Korea ............ 1992-1461

[51] Int. Cl.$^5$ ............................................. G11C 8/00
[52] U.S. Cl. ............................................. 365/233; 365/193
[58] Field of Search ............ 365/233, 203, 230.03, 365/239, 193, 236

[56] References Cited

U.S. PATENT DOCUMENTS

| | | | |
|---|---|---|---|
| 4,636,986 | 1/1987 | Pinkham | 365/193 |
| 4,725,945 | 2/1988 | Kronstadt et al. | 365/230.03 |
| 4,881,206 | 11/1989 | Kadono | 365/193 X |
| 4,967,397 | 10/1990 | Walck | 365/230.03 X |
| 4,998,222 | 3/1991 | Sussman | 365/203 |

FOREIGN PATENT DOCUMENTS

0141494  8/1983  Japan ............... 365/230.03

*Primary Examiner*—Eugene R. LaRoche
*Assistant Examiner*—Son Dinh
*Attorney, Agent, or Firm*—Cushman, Darby & Cushman

[57] ABSTRACT

The present invention relates to a semiconductor memory device, and more particularly to a dynamic random access memory for accomplishing high speed data access by supplying a plurality of row address strobe signals to a chip. A plurality of row address strobe signals are supplied to a plurality of pins, and each row address strobe signal is sequentially supplied with an active signal during a data access operation. Therefore, data in a plurality of memory cell arrays is accessed during one access cycle time. Thus, since a large number of random data are provided, the data access time decreases and the performance of a system can be greatly improved.

6 Claims, 9 Drawing Sheets

SEMICONDUCTOR MEMORY DEVICE HAVING A PLURALITY OF ROW ADDRESS STROBE SIGNALS

BACKGROUND OF THE INVENTION

1. Field of the Invention

The present invention relates to a semiconductor memory device, and more particularly to a dynamic random access memory (DRAM) for driving a memory cell array by using a row address strobe signal.

2. Background Information

Advances in semiconductor memory fabrication have significantly increased the degree of integration thereof. High speed access of the data within semiconductor memory has become strongly demanded. The data access is controlled by a central processing unit (CPU). Generally, in a DRAM, a data access operation is performed by synchronizing with a system clock generated in the system, i.e. external clock. As the clock speed of the system clock is increased, the data access speed of the DRAM chip should be increased to a speed corresponding to the speed of the system clock. It is not uncommon for a system clock to operate at 66 MHz (which means that a pulse period of the system clock is 25 nano-seconds (ns)), and this will be increased in the future. The data access operation of the chip must be performed with a speed corresponding to the system clock speed. However, the data access operation of a contemporary semiconductor memory device can not keep up with the processing speed of current systems.

FIG. 1 shows the layout of a general DRAM chip. An array construction of FIG. 1 is divided into four memory arrays each having a number of sub-arrays. Moreover, the array construction may be changed according to the degree of integration of the chip. Data in each sub-array is accessed by the system control signals. The control signals are executed through pins in the exterior of the array.

FIG. 2 is a diagram showing the connection pins of FIG. 1. A TTL (transistor-transistor logic circuit) level row address strobe signal $\overline{RAS}$ and a column address strobe signal $\overline{CAS}$ are controlled by the CPU of the system. It should be noted that the row address strobe signal $\overline{RAS}$ is connected to only one pin.

FIG. 3 is a block diagram illustrating a conventional data access circuit. A control & clock part 40 receives active low signals $\overline{RAS}$, $\overline{CAS}$ and $\overline{W}$ from the chip exterior and outputs signals to a data input buffer 10, a sense amplifier & input/output gate 70, a data output buffer 80, a column decoder 60, an address counter 50, a row decoder 30 and an address buffer 20. The data input buffer 10 receives signals from the control & clock part 40 and signals DQ1-DQ4 from the chip exterior and outputs signals to the sense amplifier & input/output gate 70 as well as signals DQ1-DQ4 to the exterior of the chip. The address counter 50 receives a signal from the control & clock part 40 and outputs a signal to the row decoder 30. The data output buffer 80 receives a signal from the control & clock part 40, the sense amplifier & input/output gate 70 and signals DQ1-DQ4 from the chip exterior and outputs signals to the sense amplifier & input/output gate 70 and signals DQ1-DQ4 to the chip exterior. The column decoder 60 receives signals from the control & clock part 40 and the address buffer 20 and outputs signals to the sense amplifier & input/output gate 70. The address buffer receives address signals A0-A9 from the chip exterior, signals from the control & clock part 40 and the address counter 50 and outputs signals to the column decoder 60 and to the row decoder 30. The memory array receives signals from the row decoder 30 and the sense amplifier & input/output gate 70 and outputs signals to the sense amplifier & input/output gate 70.

In the construction of the DRAM shown in FIG. 1, a number of sub-arrays having a number of accessible memory cells with multiple rows and columns are provided depending on the integrated degree of the chip. In FIG. 3, a memory array 100 includes one sub-array or more. In the case of 4 Megabit DRAM, 16 megabit DRAM or more highly integrated semiconductor memory device, usually a number of sub-arrays are arranged within the memory array 100. In addition, a sense amplifier and a data line, etc. are separately provided and a buffer for simultaneously generating data to the exterior of the chip is provided. The operation of the circuit shown in FIG. 3 is described by way of a nibble mode example. The nibble mode is an operating cycle performing a page mode cycle at high speed in the operating mode of the DRAM. In the page mode a column address is not applied from the exterior, but incremented in the interior of the DRAM device.

An example of the timing of a nibble mode operation is shown in FIG. 4. The nibble mode is identical to the page mode except that a column address is not strobed, and the parts which are not strobed can be repeated at high speed. In the case of 16 megabit DRAM, an accessible memory cell with the nibble mode cycle is data of 4 bits. In FIG. 3, one row address strobe $\overline{RAS}$, one column address strobe signal $\overline{CAS}$, and a number of address lines A0 to A9 control the access of data respectively. A number of sub-arrays are activated when the row address strobe signal $\overline{RAS}$ goes to logic level "low" enabling the chip. Subsequently, data stored in the memory cell is read out to the exterior pins of the chip by a series of active cycles.

On the other hand, in order to read out new data having a different column address, a subsequent row address strobe signal $\overline{RAS}$ is set to logic level "high". Therefore, a data output chain is reset and a time interval t1 exists as shown in FIG. 4. Thereafter, the above-mentioned process is repeated by a logic level "low" row address strobe signal $\overline{RAS}$. Thus, 4 bits of data are produced in response to the column address strobe signal $\overline{RAS}$. While the row address strobe signal $\overline{RAS}$ is reset during the interval t1 (i.e. the signal $\overline{RAS}$ is precharged), output data is in a "don't care" state. After the signal RAS is activated 4 bits of data are produced.

In order to improve the performance of the system, a method for increasing the access speed of the DRAM, or another method for providing more random data during a given time should be implemented. However, methods for increasing the access speed have limitations given the current processes and design techniques. Further, the access speed of data is too slow with regards to the speeds of current CPUs. In the nibble mode, if a cycle time of the column address strobe signal $\overline{CAS}$ is 15 ns and that of the row address strobe signal $\overline{RAS}$ is 120 ns (in this case, a precharge time of the row address strobe signal $\overline{RAS}$ becomes 60 ns), data of 4 bits is produced during 60 ns and no data can be generated during the remaining 60 ns of the interval t1. Consequently, increases in the access speed of data has limitations, since data can not be generated during the precharge cycle.

SUMMARY OF THE INVENTION

It is therefore an object of the present invention to provide a DRAM responsive to a high speed system clock supplied from the exterior of the DRAM.

It is another object of the present invention to provide a DRAM capable of successively supplying data within the different memory cell arrays to the exterior during one data access cycle.

It is a further object of the present invention to provide a DRAM capable of successively generating data produced from one memory cell array, and data produced from another memory cell array precharged when the memory cell array is in an active state and activated when the memory cell array is in a precharge state in response to the high speed system clock supplied from the exterior during one data access cycle.

In accordance with one aspect of the present invention, a DRAM comprises:
a plurality of memory array groups each having a number of memory cells with a row and column matrix form;
a plurality of first strobe signal input terminals having the same number with the plurality of memory array groups for receiving the first strobe signals;
a clock signal input terminal connected to receive a clock signal from the exterior; and
output means for successively generating data synchronized with the clock signal from the memory array group corresponding to an active cycle of the sequentially activated first strobe signals.

In accordance with another aspect of the present invention, a DRAM includes;
a plurality of memory array groups each having a plurality of memory cells with a row and column matrix form;
a plurality of first strobe signal input terminals having the same number with the plurality of memory array groups for receiving first strobe signals;
a clock signal input terminal for receiving a clock signal from the exterior; and
precharge means for sequentially activating the first strobe signals and for precharging bit lines of the memory array group corresponding to the first strobe signal of an inactive state.

Thus, the first strobe signals synchronized with the clock signal is sequentially supplied with a signal of a first level, the DRAM has a cycle for successively producing data of the plurality of memory array groups. Moreover, the first level is a level capable of activating a given signal, and the first strobe signal is a row address strobe signal. Further, the DRAM generate data of each memory cell array synchronized with a system clock at high speed.

BRIEF DESCRIPTION OF THE DRAWINGS

These and other objects as well as the advantages and the features of the present invention will be more apparent from the detailed description of the preferred embodiment when taken in conjunction with the attached drawings, in which.

DETAILED DESCRIPTION OF THE INVENTION

There is an tendency in highly integrated semiconductor memory devices that the number of pins included in one chip increases as the degree of integration of a semiconductor memory device is improved. It should be noted that as the integration density is improved, a DRAM in accordance with the present invention can be effectively operated. Furthermore, the number of external row address strobe signals and pins as input terminals corresponding thereof is determined by the arrangement of a memory array group included in one chip. It should be readily apparent that the signals shown in the figures are exemplary and could be either active low or active high.

Figure 1:
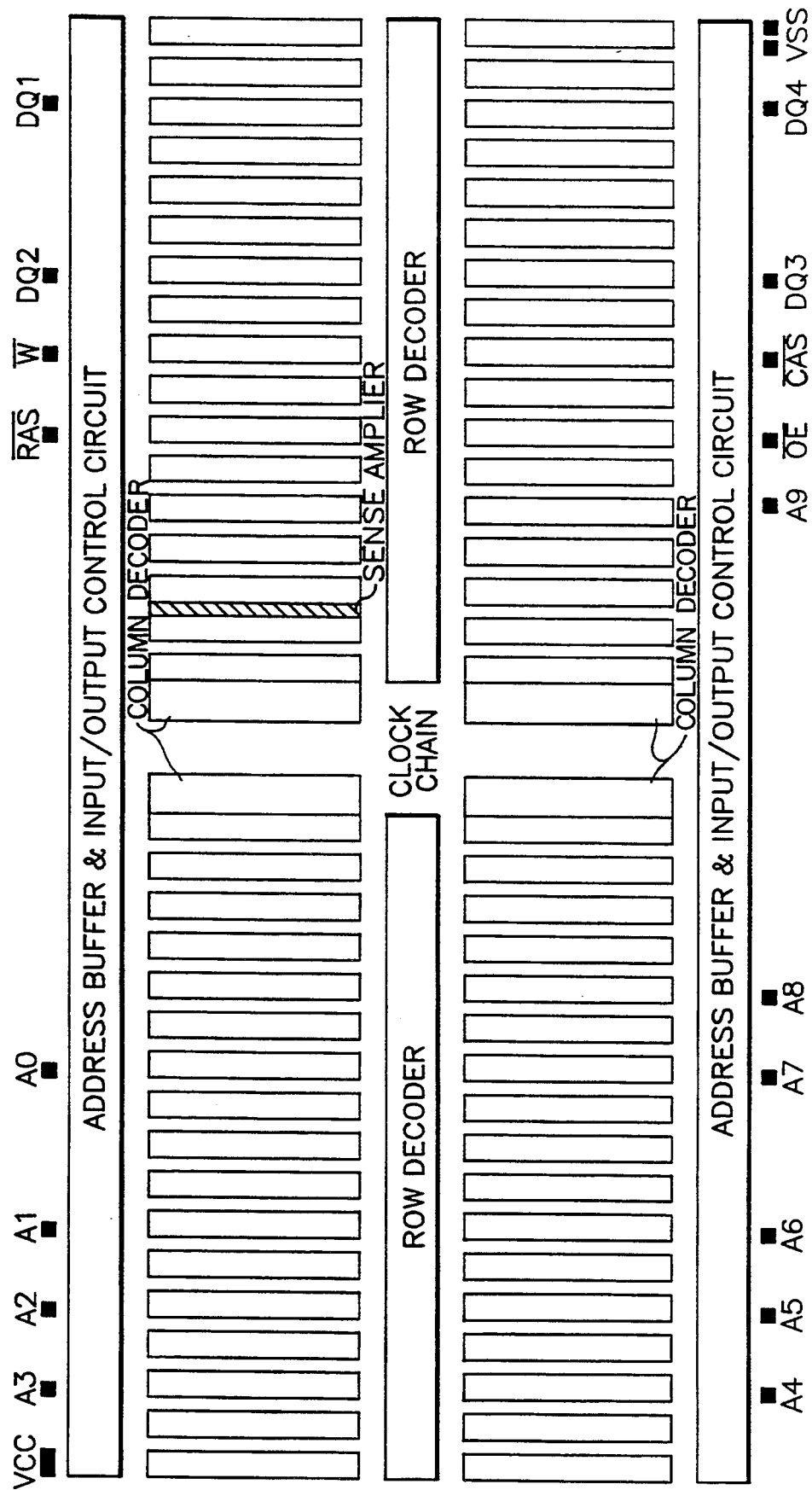
FIG. 1 is a diagram illustrating the construction of a general DRAM chip.
Figure 2:
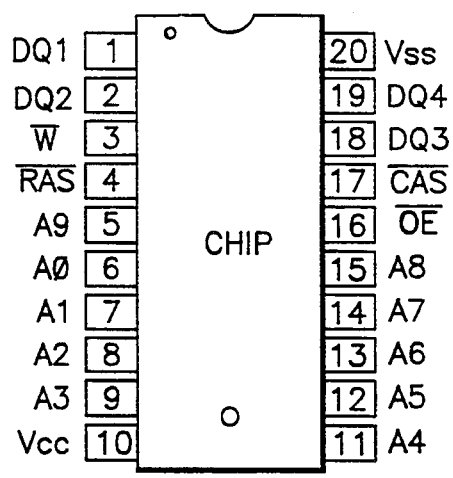
FIG. 2 is a diagram illustrating the connection pins of FIG. 1.
Figure 3:
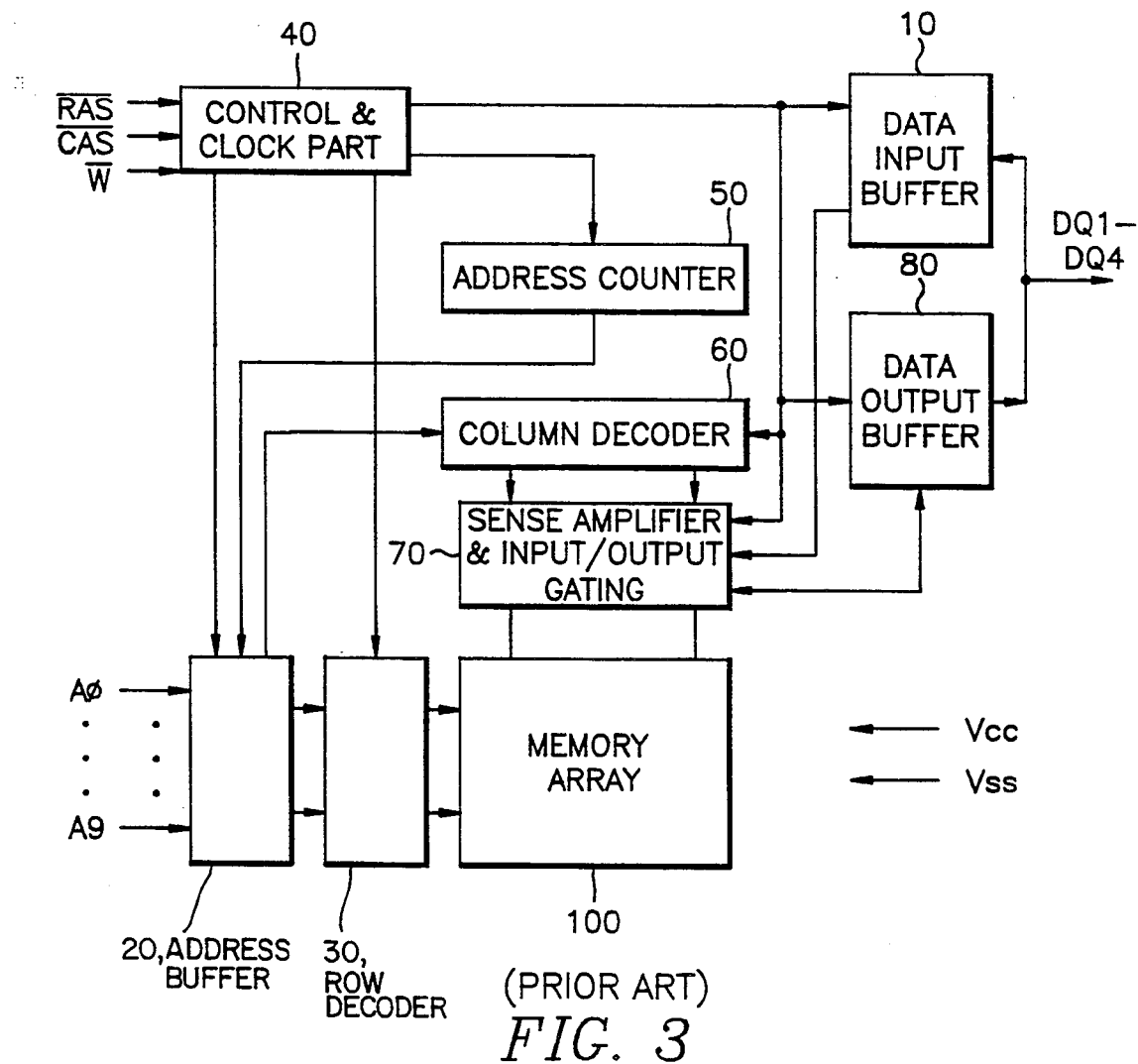
FIG. 3 is block diagram illustrating a conventional data access operation.
Figure 4:
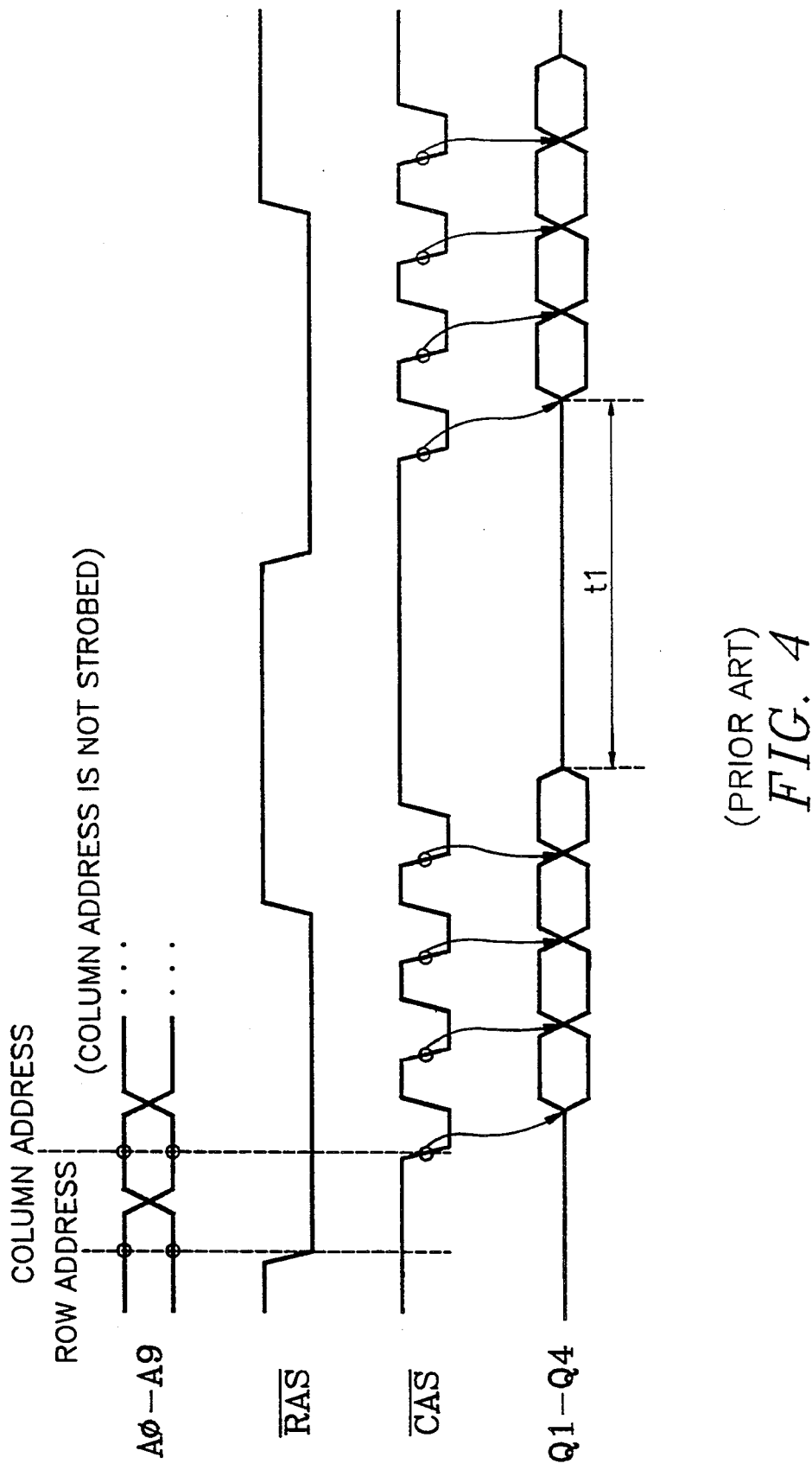
FIG. 4 is a timing chart of a data access operation of FIG. 3.
Figure 5:
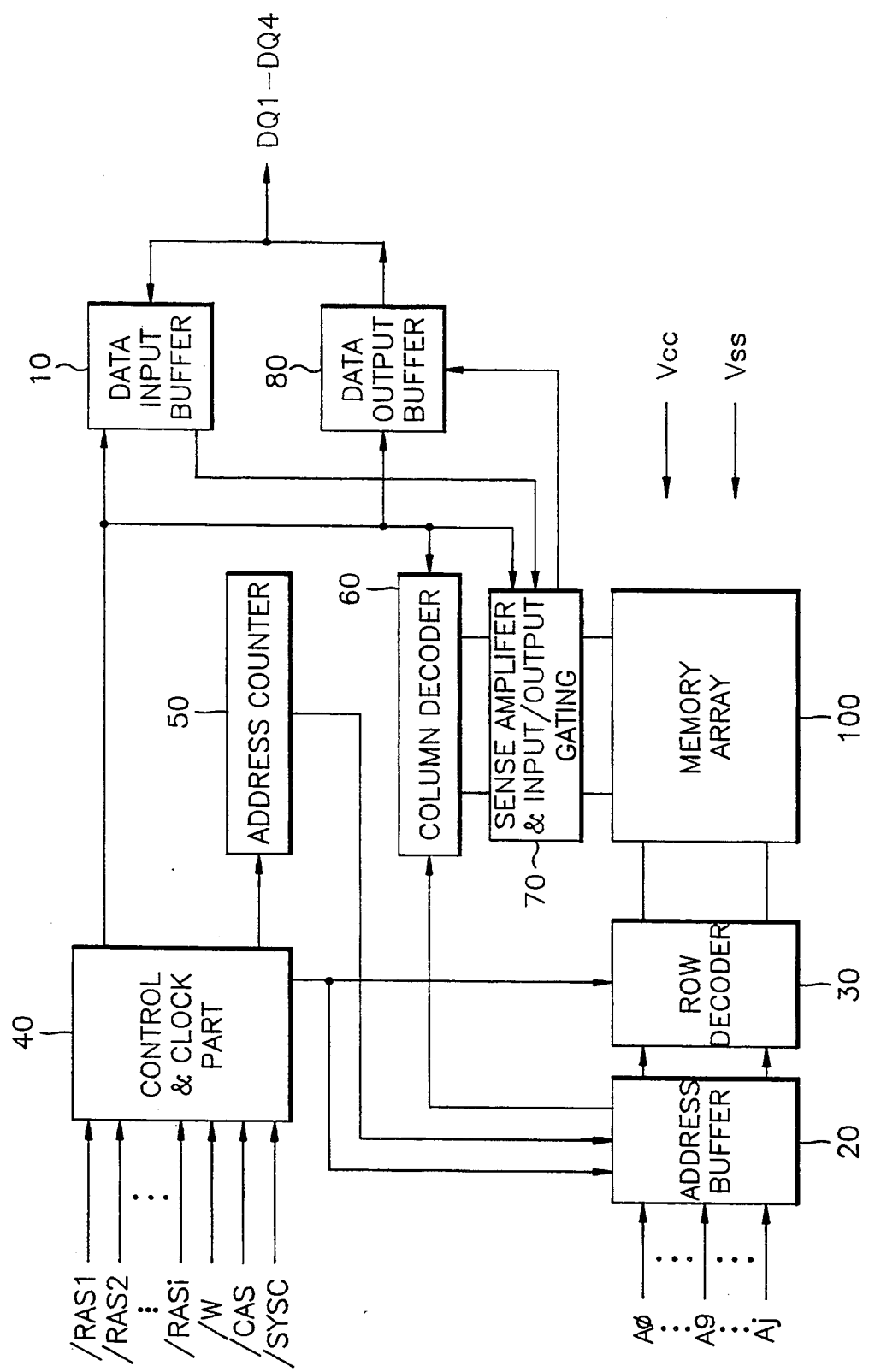
FIG. 5 is a block diagram illustrating a data access operation according to the present invention.

The construction of the circuit shown in FIG. 5 is different from that shown in FIG. 3 in that a plurality of row address strobe signals $\overline{RAS1}$ to $\overline{RASi}$ and an external system clock SYSC are supplied from the system and applied to a control & clock part 40. In addition, address lines Ao–Aj are shown instead of A0–A9.

Figure 6:
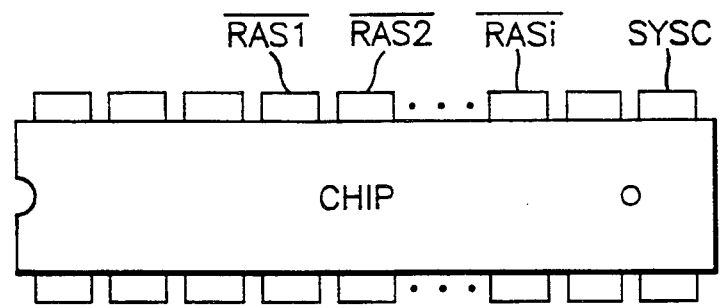
FIG. 6 is a diagram illustrating the connection of pins of a DRAM according to the present invention.

FIG. 6 shows the connection pins corresponding to the signal lines shown in FIG. 5. The number of pins included in a semiconductor memory device increase according to the increase in the degree of integration. Therefore, the number of address lines A0 to Aj may be increased. Hence, the pins for receiving the row address strobe signals $\overline{RAS1}$ to $\overline{RASi}$ receiving the external system clock SYSC should be provided.

Figure 7A:
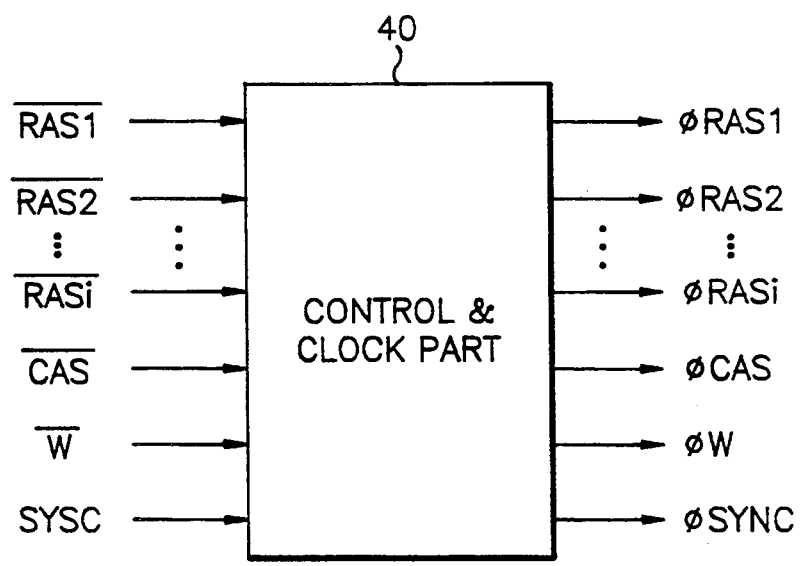
FIGS. 7A to 7D are block diagrams of each control signal of FIG. 5.

Control signals of the control & clock part 40 of FIG. 5 are indicated in FIG. 7A. The row address strobe signals $\overline{RAS1}$ to $\overline{RASi}$ (supplied from the exterior of the chip) are converted into signals $\phi\overline{RAS1}$ to $\phi\overline{RASi}$ respectively. The external system clock SYSC is converted to an internal system clock $\phi$SYSC.

Control signals of the control & clock part 40 of FIG. 5 are indicated in FIG. 7A. The external row address strobe signals $\overline{RAS1}$ to $\overline{RASi}$ (supplied from the exterior of the chip) are converted into internal signals $\phi$RAS1 to $\phi$RASi respectively. The external system clock SYSC (as an external signal) is converted to an internal system clock $\phi$SYSC signal.

Figure 7B:
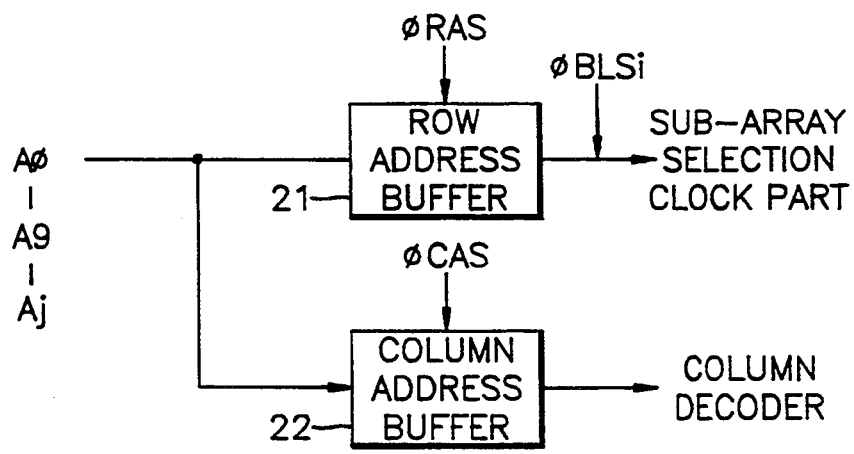

FIG. 7B shows the address buffer 20 (shown in FIG. 5) which includes row and column address buffers 21 and 22 respectively. The address lines AO to Aj are supplied to both of the row and column address buffers 21 and 22. The row address buffer 21 is enabled when any one of the external row address strobe signals $\overline{RAS1}$ to $\overline{RASi}$ is activated. A signal $\phi$BLSj (j=1−i) for selecting a desired sub-array is generated by the row address buffer 21 when activated.

Figure 7C:
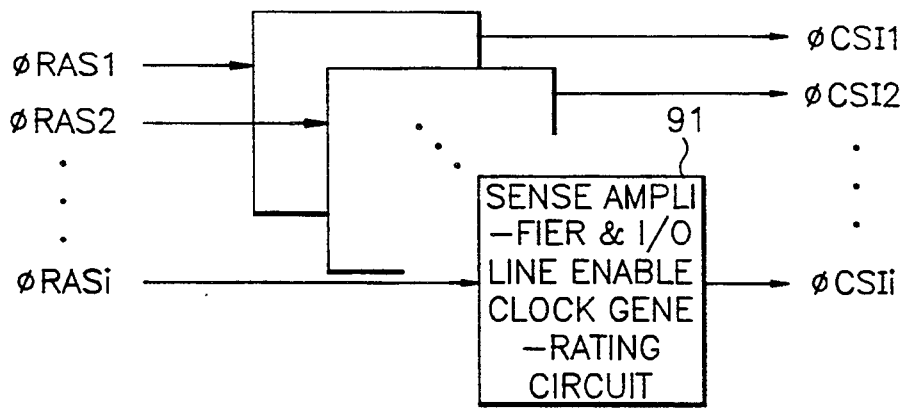

The preferred embodiment of the DRAM shown in FIG. 7C requires a sub-array. A sub-array drive clock generating device (not shown) selects a given sub array from the number of sub arrays in the semiconductor memory device. A control device for simultaneously driving the sub-array drive clock generating device is necessary. The internal row address strobe signals $\phi$RAS1 to $\phi$RASi (produced by the control & clock part 40 shown FIG. 7A) are each applied to a corresponding sense amplifier & input/output (I/O) line enable clock generating circuit 91. The number of the sense amplifier & I/O line enable generating circuit 91 is determined by the number of the internal row address strobe signal lines $\phi$RAS1 to $\phi$RASi, (i.e. by the number of sub-array groups). FIG. 7c illustrates three such sub-array groups.

Figure 7D:
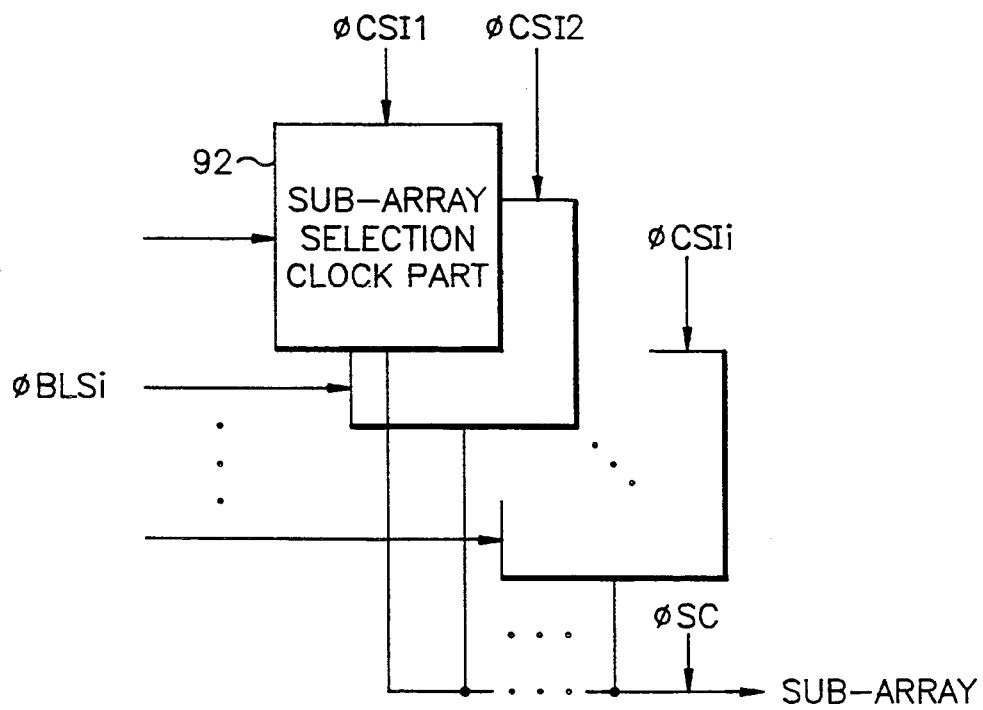

FIG. 7D shows that one of output signals $\phi$CSI1 to $\phi$CSIi of each sense amplifier & I/O line enable clock generating circuit 91 are supplied to corresponding sub-array select clock parts 92 to generate a sub-array select clock $\phi$SC. In more detail, each sub-array select clock part 92 receives the block select signal $\phi$BLSi (produced by the row address buffer 21 shown in FIG. 7B) and the output signals $\phi$CSI1 (produced by the sense amplifier & I/O line enable clock generating circuit 91) thereby producing the sub-array select clock $\phi$SC. The sense amplifier and I/O line enable clock generating circuit 91 (shown in FIG. 7C) and the sub array selection clock part 92 make up the sub array drive clock generating device. Each sub-array selection clock part 92 receives a corresponding output signal $\phi$CSI1 to $\phi$CSIi and $\phi$BLSi as shown. It will be readily appreciated that the number of sub-array select clock parts is determined by the number of sub-array groups. Three such sub-array groups are illustrated in FIG. 7D. The sub-array select clock $\phi$SCj (j=1−i) is a signal for driving a sense amplifier included in a selected sub-array, which will be described later on. Further, one sub-array select clock part has associated with it a further plurality of sub-array select clock circuits (not shown) and the number thereof is determined by the number of sub-arrays in one sub-array group.

Figure 8A:
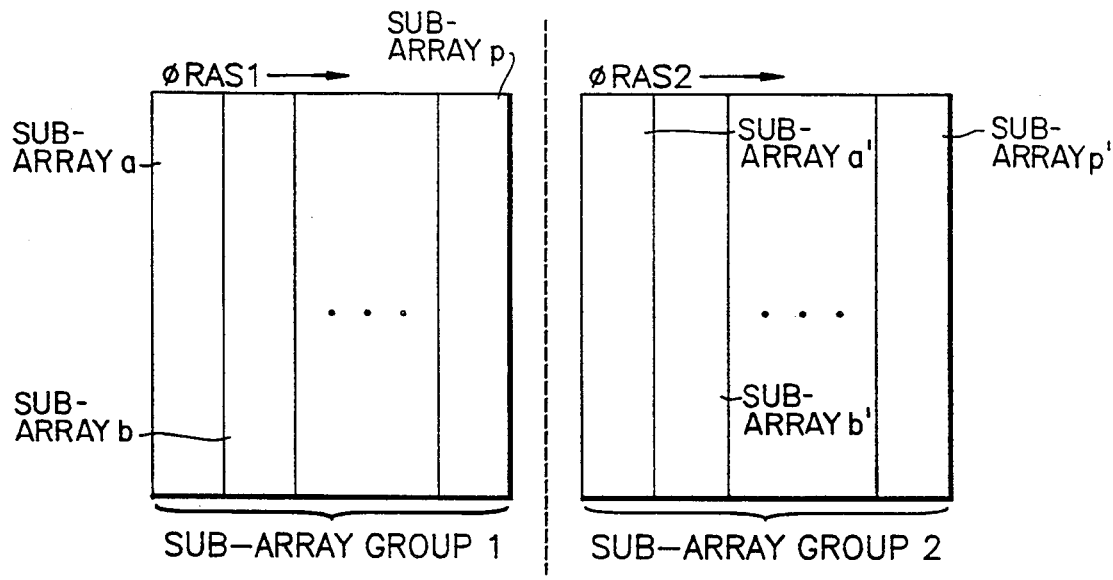
FIGS. 8A and 8B are diagrams illustrating the arrangement of sub-arrays.

FIG. 8A shows an exemplary case in which the sub-array in the memory array is arranged into two groups hereinafter used to demonstrate data access of a DRAM having a plurality of row address strobe signals. Two pins for receiving the two row address strobe signals are required, since two row address strobe signals should be applied. Each sub-array group preferably has a plurality of sub-arrays. In some cases, a sub-array group may have only one sub-array. In the preferred embodiment, two internal row address strobe signals $\phi$RAS1 and $\phi$RAS2 (after conversion from $\overline{RAS1}$ to $\overline{RASi}$ respectively) activate or precharge the two sub-array groups:- sub-array group 1 and sub-array group 2.

Figure 8B:
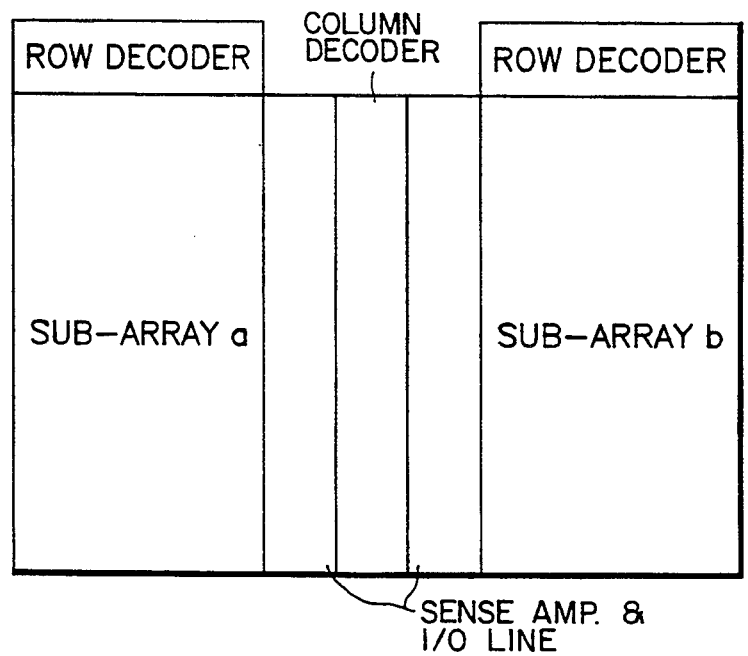

The configuration of sub-arrays adjacent to each other within a sub array group is shown in FIG. 8B. Row decoders 80 and 85 are situated above sub-array a and sub-array b, 81 and 86 respectively. A column decoder 83 is situated between sense amplifier and I/0 line 82 and 84 all three of which are located between the two sub-arrays 81 and 86.

Figure 9:
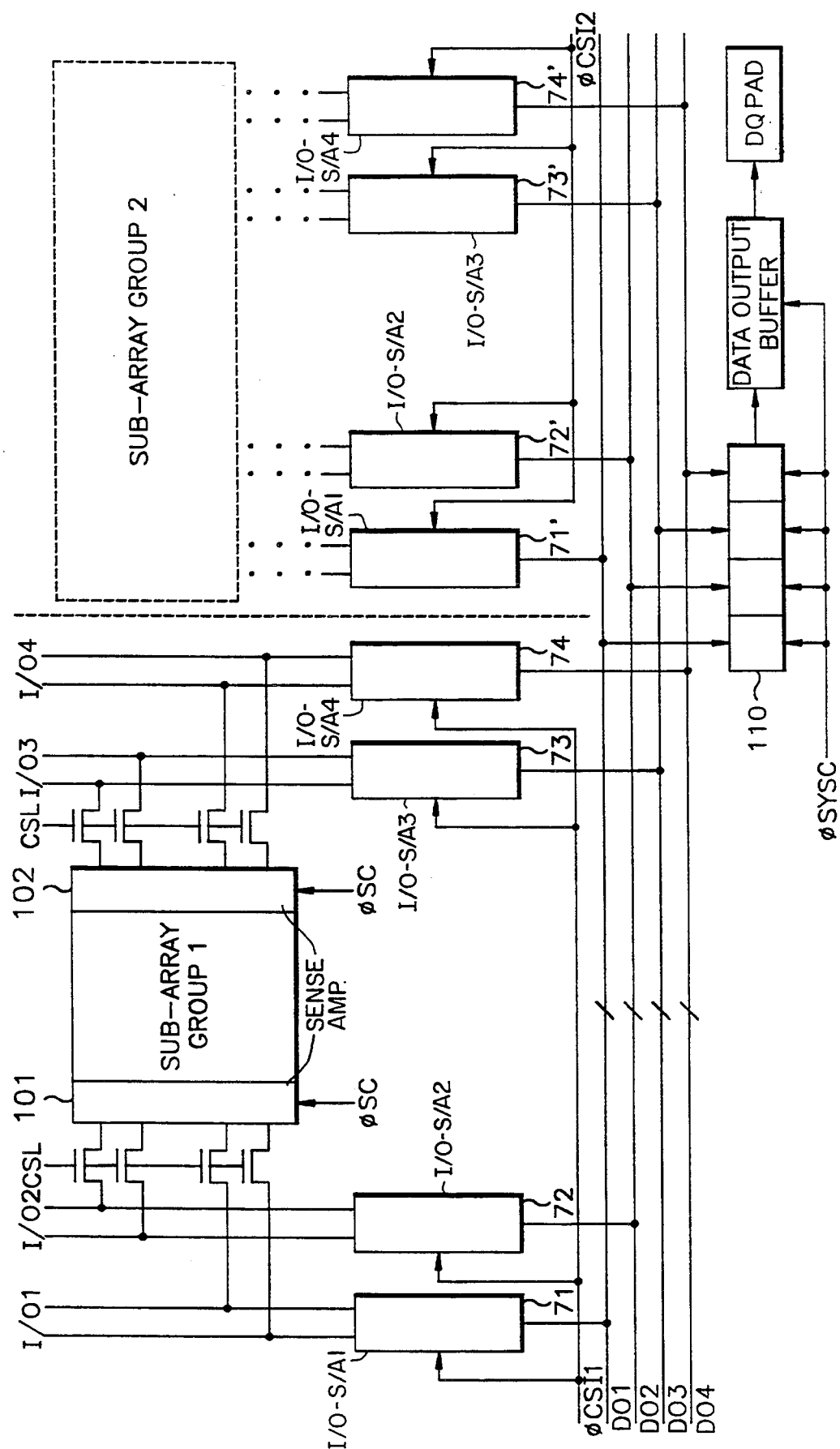
FIG. 9 is a circuit diagram illustrating a data read route of FIG. 5.
Figure 10:
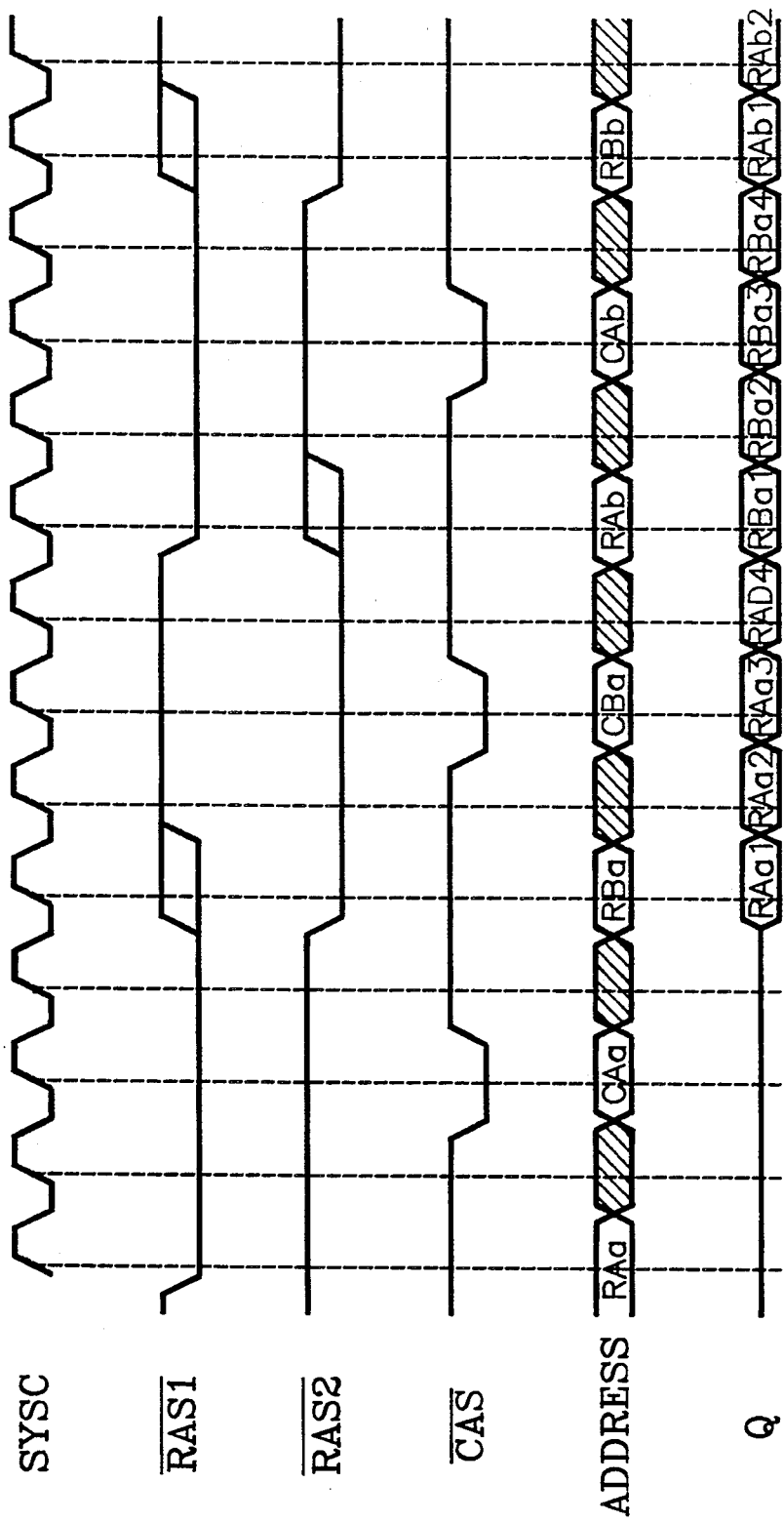
FIG. 10 is a timing chart of a data access operation of FIG. 5.

FIG. 9 is a circuit diagram to illustrate in coordination with the timing graph shown in FIG. 10, a data read routine in each sub-array shown in FIG. 8A. If the internal row address strobe signal $\phi$RAS1 is synchronized with the internal system clock $\phi$SYSC (after conversion from the external system clock SYSC) and is activated to logic level "low", a given sub-array (such as sub array a) in a sub-array group 1 is activated using the principles discussed in FIGS. 7B to 7D to read out data. In the particular example of FIG. 8A, the sub-array select clock $\phi$SC associated with $\phi$RAS1 enables sense amplifiers 101 and 102, which form the sense amplifiers for this sub-array a of the sub-array group 1. The data in this selected sub-array is connected to each I/O line. Moreover, the data is supplied to a shift register part 110 for sequentially producing the data through I/O & sense amplifiers (I/O-S/A) 71 to 74 enabled by the signal $\phi$CSI1 (generated by one of the sense amplifier & I/O line enable clock generating circuits previously described with respect to FIG. 7C). The data stored in the shift register part 110 is synchronized with the internal system clock $\phi$SYSC and successively produced. The external row address strobe signal $\overline{RAS1}$ is set to logic level "high". Subsequently, the external row address strobe signal $\overline{RAS2}$ synchronized with the external system clock SYSC goes to logic level "low" while the sub-array activated in the sub-array group 1 is precharged. A given sub-array in a sub-array group 2 is activated to read data using the principles discussed in FIGS. 7B to 7D (in the same manner as described in reference to sub-array group 1). At this time, the sub-array select clock $\phi$SC corresponding to $\phi$RAS2 enables a sense amplifier (not shown) corresponding to the selected sub-array of the sub-array group 2. Then data in the selected sub-array is connected to each I/O line. Furthermore, this data is supplied to the shift register part 110 through the I/O & sense amplifiers (I/O-S/A) 71' to 74' enabled by the signal $\phi$CSI2 (generated by one of the sense amplifier & I/O line enable clock generating circuits previously described with reference to FIG. 7C. Therefore, data stored in the shift register part 110 is synchronized with the internal system clock $\phi$SYSC and is successively generated. Thus, data of different sub-array groups is successively produced during one data access cycle as shown in FIG. 10.

A data output time of one bit corresponds to one pulse period of the system clock. For example, if the cycle time of the external row address strobe signal $\overline{RAS1}$ is 120 NS (In this case, a precharge time of the external row address strobe signal $\overline{RAS1}$ becomes 60 ns), 4 bits of data are generated during the 60 ns data access time. Thereafter, another 4 bits of data are sequentially generated, since the external row address strobe signal $\overline{RAS2}$ is activated while the external row address strobe signal $\overline{RAS1}$ is precharged during the precharge time of the 60 ns thereof. Thus, the external row address strobe signals $\overline{RAS1}$ to $\overline{RAS2}$ have the alternative active times with a time interval of a given level. Therefore, the rate of the data access during a unit time is increased by two times in comparison with the circuit shown in FIG. 3. The data access operation is performed continuously while the external system clock SYSC is applied. In the timing chart shown in FIG. 10, the external row address strobe signal $\overline{RAS2}$ falls at a rising point of the external row address strobe signal $\overline{RAS1}$. However, since the external system clock SYSC is continuously applied, even if the external row address strobe signal $\overline{RAS2}$ falls at a delayed point by a given level in comparison with the rising point of the external row address strobe signal $\overline{RAS1}$, the same result can be obtained.

As described above, even if the data access time is predetermined, a large number of random data are achieved by supplying a plurality of row address strobe signals, and thus the data access time becomes faster and the performance of a system can be greatly improved.

While preferred embodiments of the present invention have been particularly shown and described, it will be understood by those skilled in the art that foregoing and other changes in form and details may be made without departing from the spirit and scope of the present invention.

What is claimed is:

1. A dynamic random access memory (DRAM) comprising:
    a plurality of memory array groups each having a number of memory cells organized in a row and column matrix form;
    a plurality of row address strobe signal input terminals being the same in number as the number of said plurality of memory array groups for receiving row address strobe signals and supplying said row address strobe signals to said memory array groups;
    a clock signal input terminal for receiving a clock signal from the exterior and supplying said clock signal to said memory array groups; and
    output means for successively generating data synchronized with said clock signal from a memory array group corresponding to an active cycle of said row address strobe signals sequentially activated.

2. The DRAM as in claim 1, wherein a data access operation is performed even if one row address strobe signal among said plurality of row address strobe signals is supplied with a precharge signal.

3. A DRAM comprising:
    a plurality of memory array groups each having a plurality of memory cells with a row and column matrix form;
    a plurality of strobe signal input terminals being the same in number as the number of said plurality of memory array groups for receiving respective first strobe signals and for supplying said first strobe signals to corresponding ones of said memory array groups; and
    a clock signal input terminal for receiving a clock signal from the exterior and supplying said clock signal to said memory array groups, said first strobe signals being synchronized with said clock signal and sequentially activated in a given order, a first one of said first strobe signals initiating a first data read operation in connection with a first one of said memory array groups when said first one of said first strobe signals is activated, a second one of said first strobe signals initiating a second data read operation in connection with a second one of said memory array groups during a subsequent clock cycle when said second one of said first strobe signals is activated, each of said first and second data read operations being preceded by a first and second precharge operation respectively, said second precharge operation occurring during an inactive state of said first one of said strobe signals in anticipation of said second data read operation.

4. The DRAM as in claim 3, wherein said first strobe signals are row address strobe signals.

5. A dynamic random access memory (DRAM) comprising:
    a plurality of memory array groups each having a number of memory cells;
    a plurality of strobe signals being the same in number as the number of said plurality of memory array groups, said strobe signals supplied to said memory array groups;
    a clock signal from the exterior supplied to said memory array groups; and
    means for successively accessing said memory cells synchronized with said clock signal from a memory array group corresponding to an active cycle of said strobe signals sequentially activated.

6. The DRAM as in claim 5, wherein a memory cell access operation is performed even if one strobe signal among said plurality of strobe signals is supplied with a precharge signal.

* * * * *